United States Patent [19]

Kuo et al.

[11] Patent Number: 4,561,004
[45] Date of Patent: Dec. 24, 1985

[54] HIGH DENSITY, ELECTRICALLY ERASABLE, FLOATING GATE MEMORY CELL

[75] Inventors: Chang-Kiang Kuo, Houston; Shyh-Chang Tsaur, Stafford, both of Tex.

[73] Assignee: Texas Instruments, Dallas, Tex.

[21] Appl. No.: 353,304

[22] Filed: Mar. 1, 1982

Related U.S. Application Data

[62] Division of Ser. No. 88,708, Oct. 26, 1979, Pat. No. 4,317,272.

[51] Int. Cl.[4] .............. H01L 29/78; H01L 27/02; H01L 29/04; G11C 11/40
[52] U.S. Cl. .................. 357/23.5; 357/23.11; 357/41; 357/54; 357/59; 365/185
[58] Field of Search ............... 357/23 VT, 23 CS, 41, 357/54, 59; 365/185

[56] References Cited

U.S. PATENT DOCUMENTS

| | | | |
|---|---|---|---|
| 3,825,946 | 7/1974 | Frohmaw-Bentchkowsky | 357/23 VT |
| 4,099,196 | 7/1978 | Simko | 357/23 VT |
| 4,122,544 | 10/1978 | McElroy | 357/23 VT |
| 4,228,527 | 10/1980 | Gerber et al. | 357/59 |
| 4,251,829 | 2/1981 | Adam | 357/23 VT |
| 4,267,558 | 5/1981 | Guterman | 357/41 |
| 4,300,212 | 11/1981 | Simko | 357/41 |
| 4,302,766 | 11/1981 | Guterman et al. | 357/41 |
| 4,314,265 | 2/1982 | Simko | 357/41 |
| 4,331,968 | 5/1982 | Gosney et al. | 357/23 VT |

Primary Examiner—Gene M. Munson
Attorney, Agent, or Firm—John G. Graham

[57] ABSTRACT

An electrically erasable, programmable memory cell array of the floating gate type is made by a process which allows an erase window for the first level polysilicon floating gate to be positioned beneath a third level poly erase line, while maintaining a small cell size. The erase window is not beneath the second level poly control gate, so degrading of the stored charge by the read mechanism is minimized.

6 Claims, 13 Drawing Figures

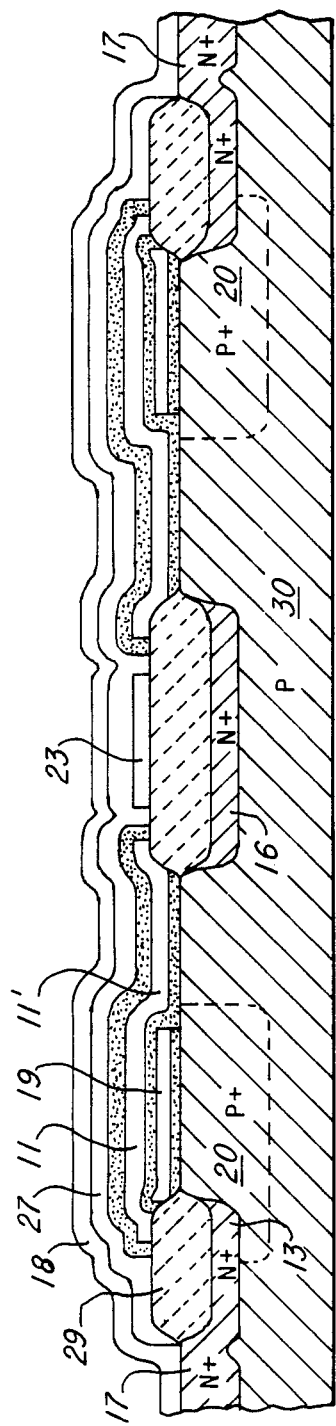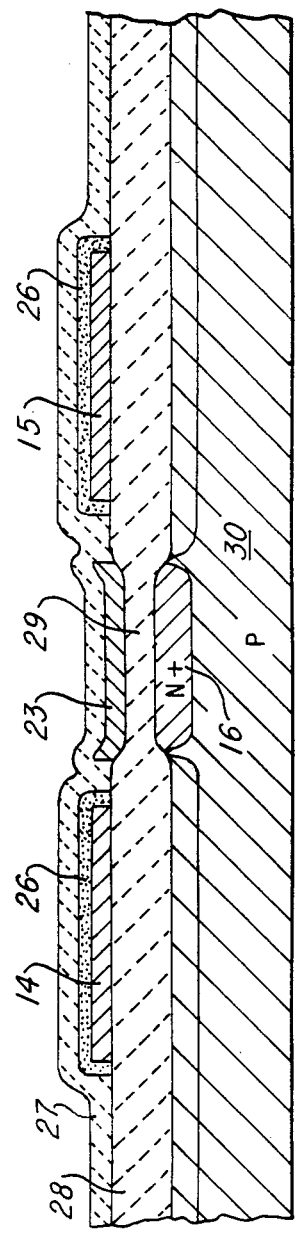
Fig.3a
Fig.3b

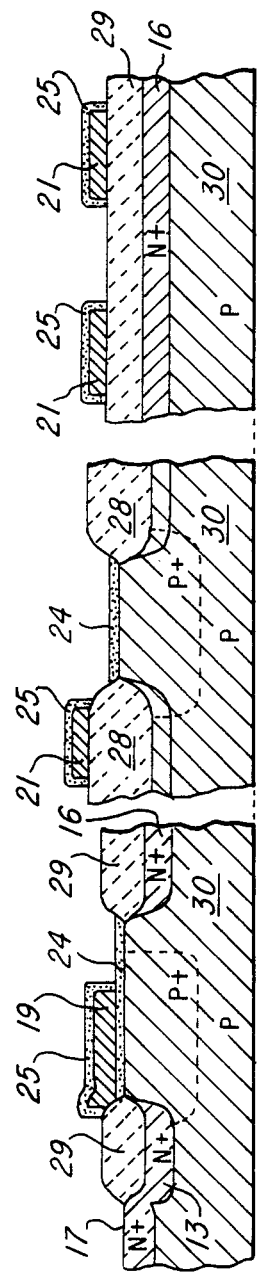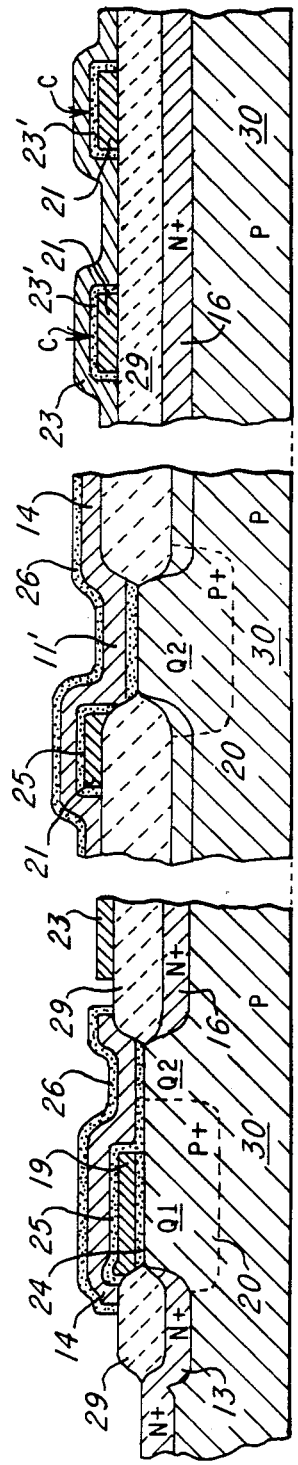

HIGH DENSITY, ELECTRICALLY ERASABLE, FLOATING GATE MEMORY CELL

This application is a division of application Ser. No. 088,708, filed Oct. 26, 1979, now U.S. Pat. No. 4,317,272, issued Mar. 2, 1982.

BACKGROUND OF THE INVENTION

This invention relates to semiconductor memory devices and method of manufacture, and more particularly to an electrically erasable, programmable read only memory of the floating gate type.

Nonvolatile memory devices using a floating gate to retain charge are made by a double level polysilicon process as set forth in U.S. Pat. No. 4,122,544 issued to David J. McElroy and U.S. Pat. No. 4,112,509 issued to Lawrence S. Wall, both assigned to Texas Instruments, or in U.S. Pat. No. 3,984,822 issued to Simko et al. These devices are widely used in microcomputers, particularly in program development.

The device of the McElroy patent included a series enhancement transistor designed to correct the problem of over-erasure wherein the channel beneath the floating gate went into depletion mode so the memory transistor would conduct even with zero volts on the control gate. However, to avoid a read-disturb condition and an over-erase phenomena, and improve speed, cell designs with an erase window were developed, as disclosed in pending applications Ser. No. 1,095 (now U.S. Pat. No. 4,267,558, issued May 12, 1981), and Ser. No. 1,097 (now U.S. Pat. No. 4,302,766, issued Nov. 24, 1981), filed Jan. 5, 1979, by Guterman and Chin, assigned to Texas Instruments.

The cell size in these prior floating gate electrically erasable EPROMs has been large due to the cell layout and configuration, and other features necessary because of the process used for manufacture. Smaller cell size is desirable in order to provide a more dense array with more cells in a given silicon area, and/or to lower cost and increase yields in manufacture.

It is the principal object of this invention to provide an improved electrically erasable, programmable memory. Another object is to provide an electrically erasable EPROM of reduced cell size. An additional object is to provide a dense array of electrically erasable EPROM cells, made by a more efficient method.

SUMMARY OF THE INVENTION

In accordance with an illustrative embodiment of the invention an electrically erasable, programmable memory cell array of the floating gate type is made by a process which allows an erase window for the first level polysilicon floating gate to be positioned beneath a third level poly erase line, while maintaining a small cell size. The erase window is not beneath the second level poly control gate, so degrading of the stored charge by the read mechanism is minimized.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a–3f are elevation views in section of the cells of FIG. 1, taken along the lines a—a, b—b, c—c d—d, e—e and f—f respectively; and FIGS. 4a–4e are elevation views in section of the cell array of FIGS. 1 and 3a–3f, at successive stages in the manufacturing process, taken generally along the lines a—a, e—e, and f—f in FIG. 1.

DETAILED DESCRIPTION OF SPECIFIC EMBODIMENTS

Figure 1:
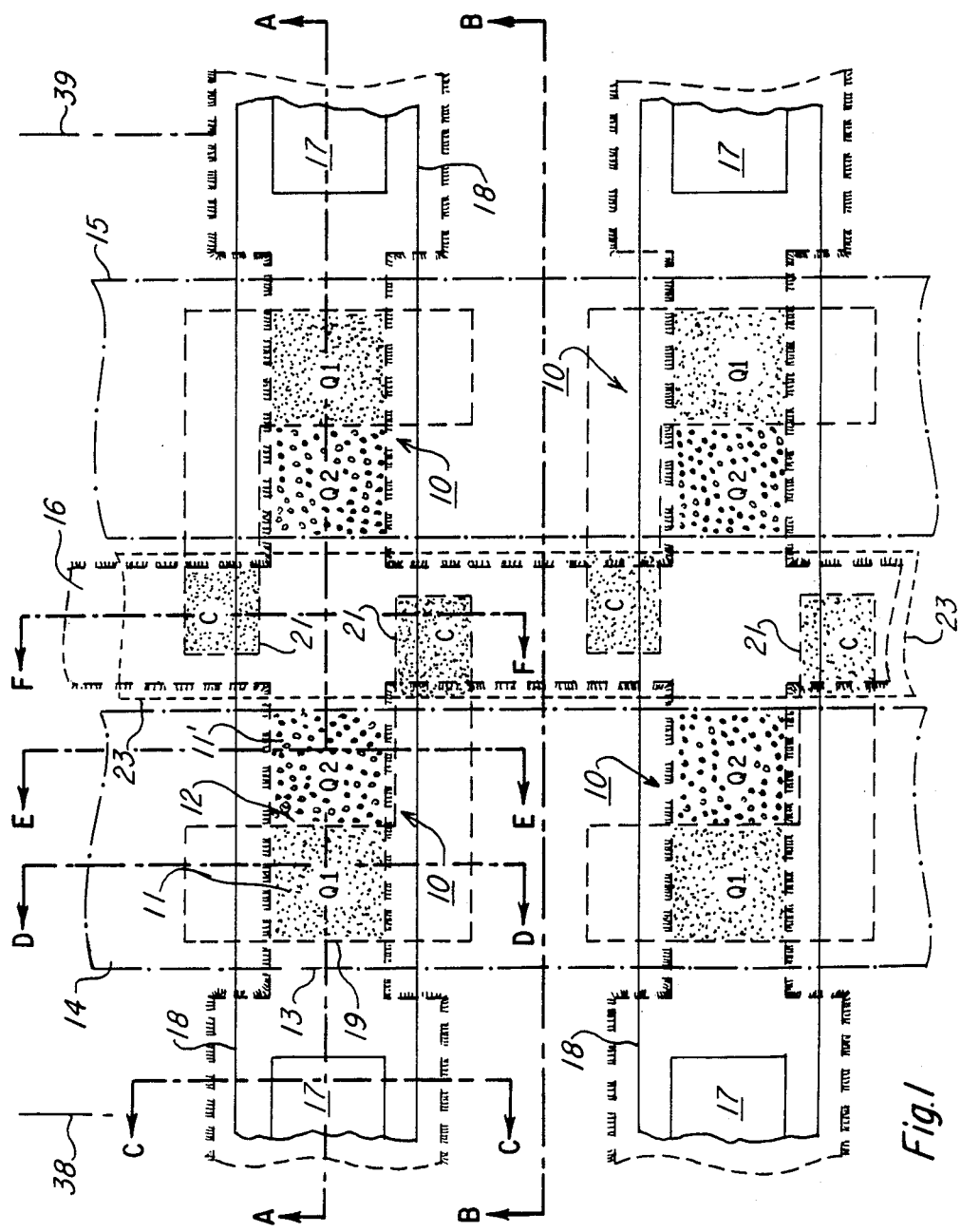
FIG. 1 is a greatly enlarged plan view of a small portion of a semiconductor chip showing the physical layout of a part of a cell array made according to the invention.
Figure 2:
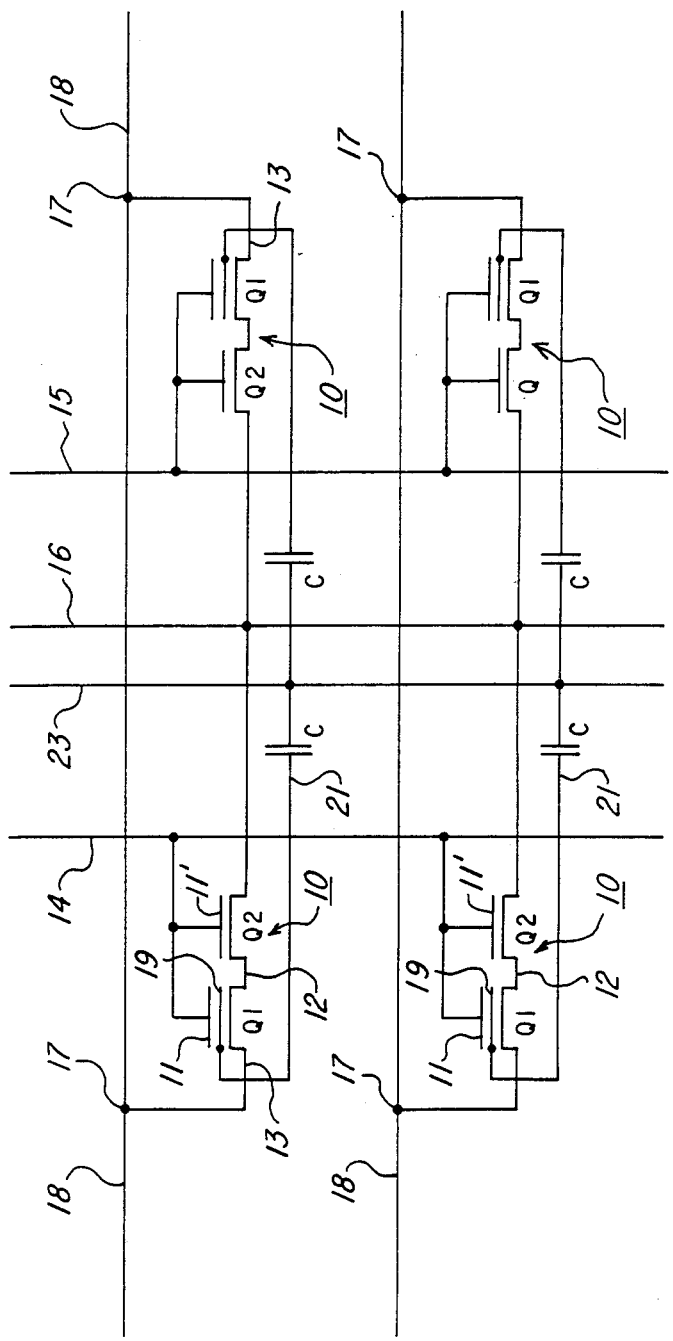
FIG. 2 is an electrical schematic diagram of the cell array of FIG. 1.
Figure 3E:
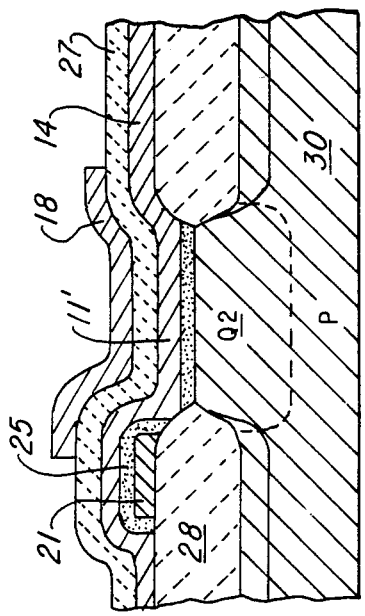
Figure 3C:
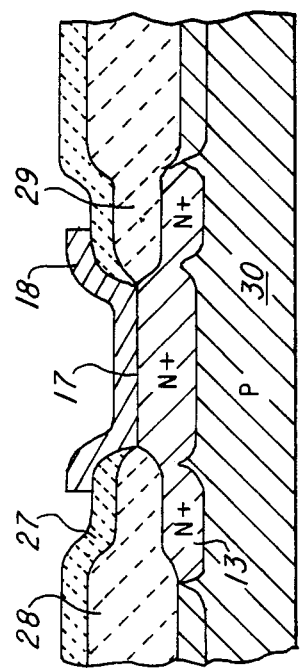
Figure 3F:
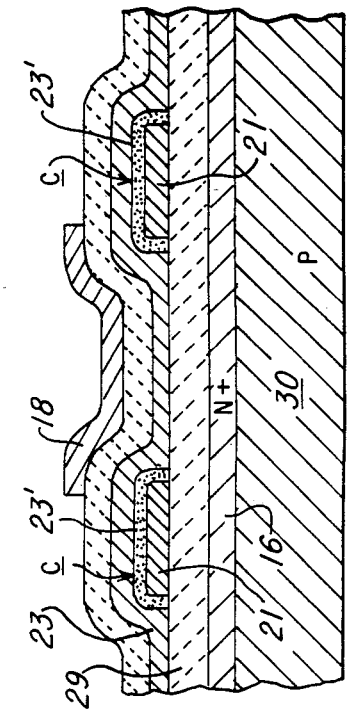
Figure 3D:
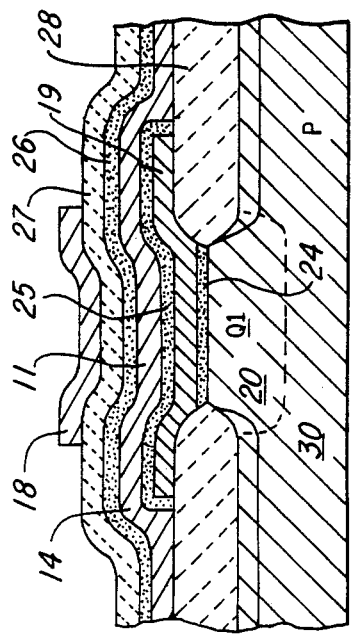

With reference to FIGS. 1, 2, and 3a–3f, an electrically erasable, programmable read only memory is illustrated which is made according to the invention. The array consists of a large number of cells 10, only four of which are shown. Each cell includes a memory transistor Q1, a series enhancement transistor Q2, and an erase window C. The memory transistor has a control gate 11, a source 12 and a drain 13. The gates 11 are parts of polysilicon strips 14 and 15 which are the X address lines for the array. The sources 12 are coupled through Q2 to elongated N+ diffused regions 16 which are connected to ground or Vss, while the drains are part of N+ diffused regions connected via metal-to-silicon contacts 17 to metal strips 18 which are Y output lines. A floating gate 19 is interposed between the control gate 11 and the channel in each transistor Q1. A P+ tank 20 is provided in each channel area for optimum programming characteristics.

Each of the series enhancement transistors Q2 includes a gate 11' which is an extension of the control gate 11 but without the floating gate 19 interposed. The sources of the transistors Q2 are formed by the N+ region 16, while the drains are formed by the edges of the inverted channels of the transistors Q1 when such transistors are on.

The erase window C is created above a segment 21 of first level polycrystalline silicon which is an extension of the floating gate 19. A third level polycrystalline silicon strip 23 extends down to form the upper plate of the erase window C at an area above a thin oxide layer 23' which is formed by a process selected to optimize the tunnelling effect for the erase mechanism.

A thin gate oxide layer 24 separates the first level floating gate 19 from the silicon surface, and another thin thermal oxide layer 25 separates the floating gate from the second level control gate 11 in each cell, which in turn is insulated from the third level poly by an oxide layer 26, in the event that the third level overlaps the second level. A thick layer 27 of deposited oxide overlies the upper level of polysilicon. A thick field oxide coating 28 covers parts of the bar not occupied by the transistors or diffused interconnects, and P+ channel stop regions are formed underneath all the thick field oxide. A thinner field oxide coating 29 covers the N+ diffused regions 13 and 16.

The array is formed on a silicon bar which would typically contain perhaps 64 or 128K bits on a bar less than about 200 mils on a side or 40,000 square mil area, depending upon the bit density. The four cells shown would be on a minute part of the bar, perhaps about one mil wide. A 64K cell array would require 256 of the X address lines such as 14 and 15 and 256 of the Y lines like the line 18, providing 65,536 bits.

The cell array is programmed by injection of electrons into the floating gates 19 by application of high voltage to a selected one of the polycrystalline silicon strips 14 and 15 and one of the Y lines 18 to raise the threshold voltage of the selected one of the cells 10 to a value above that which will be turned on by a logic level voltage on an address line 14, 15, etc. Thus, a cell 10 is programmed by holding its drain 13 and control gate 11 at a high voltage, typically +25 V, DC, while the source 12 is at Vss. A large current flows in the channel, causing electrons of high energy state to traverse the gate oxide layer 24 and charge the floating gate 19. After the programming voltage is removed the floating gate remains charged. All other cells with low voltage on either gate or drain will not be affected; that is, if the X line 14 and one Y line 18 are high while the X line 15 and the other Y line 18 are low, the upper left cell 10 is programmed by charging its floating gate but the other three cells are not.

The cell is deprogrammed or erased by establishing a condition whereby the charge on the floating gate 19 is dissipated through the oxide layer 23' into the poly strip 23 which is held at a high voltage, +25 V, while the line 16 is at Vss, the line 18 is at Vss, and the address line 14 or 15 is at +25 V.

In a read operation, the X address selects one of the lines 14 and 15, or one of the other of the 256 such lines in a 64k array, and this selected line is held at logic 1 level or about +5 V. The remaining X address lines are held at Vss, logic 0. The Y address selects one of the 256 lines 18, and this line is connected via the Y decoder to the output. The Y lines usually would be precharged prior to an access cycle for a dynamic memory, so the selected line will condtionally discharge depending upon whether the selected cell 10 at the intersection of the addressed X and Y lines is programmed a 1 or a 0. Precharge is not necessary for a static memory.

Turning now to FIGS. 4a-4e, a process for making the cell array of the invention will be described. The right hand side of these FIGURES corresponds to FIG. 3f, the middle part to FIG. 3e, while the left hand side corresponds to the section view of the transistors Q1 and Q2, FIG. 3a. The starting material is a slice of P-type monocrystalline silicon, typically four inches in diameter and twenty mils thick, cut on the <100> plane, of a resistivity of about 6 to 8 ohm-cm. As mentioned above, in the FIGURES the portion shown of the bar 30 represents only a very small part of the slice, perhaps 1 or 2 mils wide. After appropriate cleaning, the slice is oxidized by exposing to oxygen in a furnace at an elevated temperature of perhaps 1100° C. to produce an oxide layer 31 over the entire slice of a thickness of about 1000 Å. First, a boron implant is performed using a photoresist mask to create the P+ tanks 20. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 28 and the P+ channel stops. The resist is developed, leaving areas where nitride is then etched removing the exposed part of the nitride layer 32 but leaving in place the oxide layer 31.

Using photoresist and nitride as a mask, the slice is now subjected to an implant step to produce the channel stop regions whereby boron atoms are introduced into unmasked regions 33 of silicon. The regions 33 will now exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
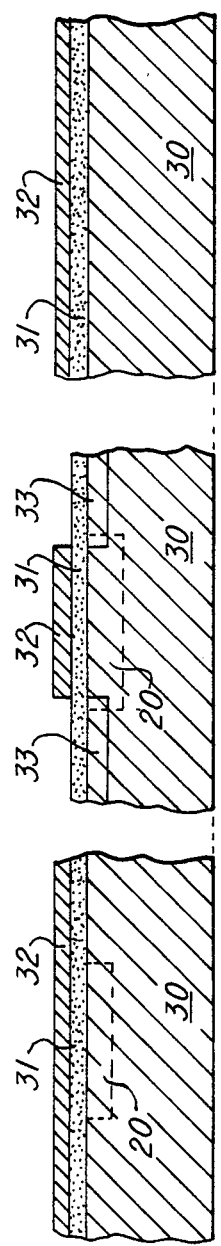
Figure 4B:
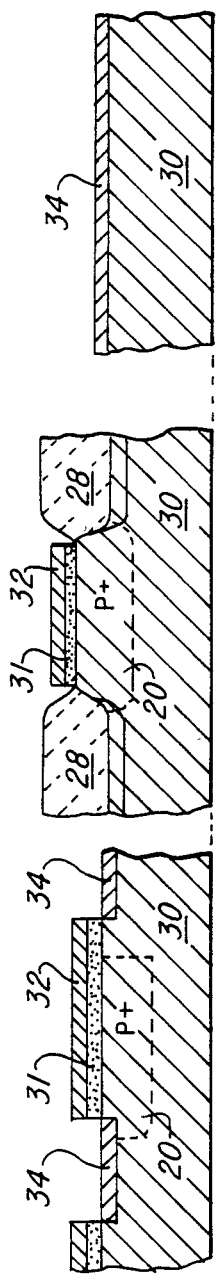

The next stop in the process is the initial formation of field oxide 28, which is done by subjecting the slices to steam or an oxidizing atmosphere at about 900° to 1000° C. for several hours. This causes a thick field oxide layer 28 to be grown as seen in FIG. 4b. This region extends into the silicon surface because silicon is consumed as it oxidizes. The remaining parts of the nitride layer 32 mask oxidation. The thickness of this layer 28 is about 6000 Å, about half of which is above the original surface and half below. The boron doped P+ regions 33 formed by implant will be partly consumed, but will also diffuse further into the silicon ahead of the oxidation front to produce P+ field stop regions which are much deeper than the original regions 33. At this point, the field oxide layer 28 is not nearly as thick as it will be in the finished device. Additional thickness results from subsequent heat treatments.

The slice is now coated with another photoresist layer and exposed to ultraviolet light through a mask which defines the drain areas 13 as well as the lines 16 which are to be N+ diffused. After developing the photoresist the slice is again subjected to a nitride etchant which removes the parts of the nitride layer 32 now exposed by holes in the photoresist. The parts of the oxide layer 31 exposed when this nitride is removed are then etched to expose bare silicon. A phosphorus diffusion produces the N+ regions 34 which will subsequently become the drains, etc. Instead of diffusion, these N+ regions 34 may be formed by arsenic ion implant, in which case the oxide layer 31 would be left in place and an anneal step used before the subsequent oxidation.

Figure 4C:
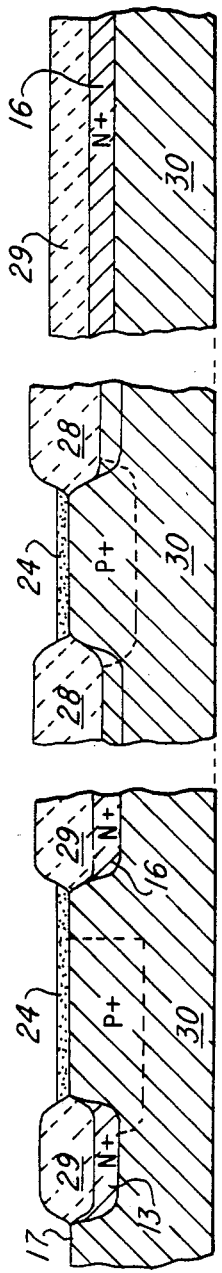

Referring to FIG. 4c, a second field oxidation step is now performed by placing the slice in steam or dry oxygen at about 1000° C. for several hours. This oxidizes all of the top of the slice not covered by the remaining parts of the nitride layer 32, producing field oxide 29 which is about 5000 Å thickness. During this oxidation, the areas of field oxide 28 grow thicker, to perhaps 10,000 Å. The N+ regions 34 are partly consumed but also diffuse further into the silicon ahead of the oxidation front to create the heavily doped regions 13 and 16.

Next the remaining nitride layer 32 is removed by an etchant which attacks nitride but not silicon oxide, then the oxide 31 is removed by etching and the exposed silicon cleaned. The gate oxide 24 is grown by thermal oxidation to a thickness of about 500 to 800 Å. This oxide is removed above the contact areas 17 by a photoresist operation, and a phosphorus diffusion creates the N+ regions 35 beneath these contact areas. In areas of the slice where depletion load devices are required, although not pertinent to this invention, a masked ion implant step would be done at this point. Likewise, the threshold voltages of the transistors Q1 and Q2 in the cell array or in the periphery may be adjusted by ion implants. Also, windows for first level polysilicon to silicon contacts, if needed in peripheal circuits, are patterned and etched at this point using photoresist; none are needed in the cell array itself.

As seen in FIG. 4d a first layer of polycrystalline silicon is deposited over the entire slice in a reactor using standard techniques to a thickness of about 5000 Å. This layer is doped with phosphorus by an N+ diffusion or implant to make it highly conductive. This first level polysilicon layer is patterned by applying a layer of photoresist, exposing to ultraviolet light through a mask prepared for this purpose, developing, then etching both photoresist and exposed oxide. The remaining photoresist masks certain areas of the polysilicon to define the floating gate 19 and the erase window segments 21 in the cell array. The unmasked polycrystalline silicon is etched away, so the resulting structure seen in FIG. 4d includes a part of the remaining first level polysilicon layer which provides what will be the floating gates. The thin thermal oxide 24 underneath each gate 19 is the gate oxide of the memory cell transistor Q1.

The upper surface of the first level polysilicon is oxidized by exposing the slice to an oxidizing atmosphere at 900° to 1000° C. to create the thermal oxide layer 25 over the floating gates to a thickness of about 1000 Å. A second level of polycrystalline silicon is next deposited over the slice, then masked by photoresist and etched to leave the address lines 14 and 15 which also form the control gates 11 and 11'. The upper surface of the second level poly is oxidized as before to form the layer 26 in case the third level poly overlaps the second level, and to act as an etch barrier.

The erase window C is next created. A photoresist operation masks all of the top surface of the slice except an area where the windows C are to exist. Using this photoresist as a mask, all of the thermal oxide is removed to expose the upper surface of the segment 21 of first level poly, at the window C. Thermal oxide layer 23' is then formed by process which enhances tunnelling, such as at lower temperature than the oxide 24,25 or 26, or in steam instead of dry oxygen, or doped at a lower level. The thickness is about 600-800 Å. Third level poly is then deposited, doped, and patterned. In FIG. 3, a thick layer 27 of silicon oxide is deposited by decomposition of silane at a low temperature, about 400° C. This layer 27 insulates the metal level from the second/third level polycrystalline silicon, and is referred to as multilevel oxide.

Referring to FIG. 3, the multilevel oxide layer 27 is now patterned by a photoresist operation, exposing the contact areas 17 for metal-to-silicon contacts along the lines 18 in the cell array and contact areas for a metal-to-silicon or metal-to-poly contact for the peripheral transistors. Metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves the metal strips 18.

An advantage of the cell structure of the invention is that the erase window C for two adjacent cells is positioned over the Vss line 16, an N+ moat region, so space is used for two functions that would be otherwise used for only one. This is made possible by the process which allows poly over N+ moat regions. Also, it is significant that alignment and spacing of the second and third level poly is not critical; the third level poly strip 23 can overlap the second level poly strips 14, 15 without harm. In addition, the process allows the memory transistor Q1 and series transistor Q2 to be formed without the various implant steps and critical alignment problems heretofore encountered. A much smaller cell size is thus provided, compared to the cell of U.S. Pat. No. 4,302,766, for example.

An array of cells would be formed by mirroring the pattern shown about on axis 38 at the left and 39 at the right of FIG. 1. Thus, the contacts 17 are shared with adjacent cells left and right of the four cells shown.

In another embodiment of a process for making the cell of the invention, the contact areas 17 are formed at a different time. Peripheral to the cell array, a number of standard N-channel self-aligned silicon gate transistors may be used; that is, the source and drain regions are formed by N+ diffusion after the gate and gate oxide are defined, so the source and drain regions are self-aligned with the edges of the gate poly and gate oxide which form the diffusion mask. This process is shown and described in the above-mentioned U.S. Pat. No. 4,055,444. The contact 17 in such case would be left covered with the oxide 24 through the steps of FIGS. 4c and 4d and then when the second or third level poly is patterned (whichever of these levels is used to create the gates of peripheral transistors) the oxide is removed from 17 and the N+ source/drain diffusion for peripheral transistors also heavily dopes the silicon under contact area 17. Then, multilevel 27 is deposited and patterned, and metal is deposited. This way of making the contacts 17 does not require any added mask steps.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
   a region in a face of a body of semiconductor material, said region being of opposite type from and doped more heavily than the semiconductor material below the region in the body, said region covered by field insulator at said face,
   a first conductive layer overlying said face and separated from said semiconductor material by an insulator much thinner than said field insulator, said first conductive layer forming a first electrode located adjacent but spaced from said region, the first conductive layer including a first part overlying said region by a significant amount,
   a second conductive layer on said face overlying the first conductive layer except for said part and defining a second electrode which is substantially not overlapping said region and,
   a third conductive layer overlapping said region and said first part, said third conductive layer generally not overlapping the second conductive layer, nor overlapping the first conductive layer except for said first part.

2. A semiconductor device according to claim 1 wherein said first electrode is a floating gate of a programmable field effect transistor, said second conductive layer forms an address line and control gate for the transistor, and all of said conductive layers are polycrystalline silicon.

3. A semiconductor device according to claim 2 wherein thin gate oxide separates the floating gate from said face, said field insulator is much thicker than the gate oxide, and said first part provides an erase window over said field insulator separated from the third conductive layer by an insulator coating which enhances tunnelling.

4. A device according to claim 2 wherein said region is one end of a source-to-drain path in said face, said first conductive layer is a floating-gate electrode above said source-to-drain path, and said second conductive layer is a control gate electrode above the floating gate.

5. A device according to claim 4 wherein said third conductive layer includes an erase gate where it overlaps said first part.

6. A device according to claim 5 including a metal strip extending along said face overlying said first, second and third conductive layers and contacting the other end of said source-to-drain path at a hole in an insulator coating on said face.

* * * * *